United States Patent [19]
Carley

[11] Patent Number: 5,931,966
[45] Date of Patent: Aug. 3, 1999

[54] VITERBI DETECTOR WITH A PIPELINED LOOK-UP TABLE OF SQUARED ERRORS

[75] Inventor: L. Richard Carley, Sewickley, Pa.

[73] Assignee: Carnegie Mellon University, Pittsburgh, Pa.

[21] Appl. No.: 08/858,261

[22] Filed: May 19, 1997

[51] Int. Cl.⁶ .................................................. G11B 20/18
[52] U.S. Cl. ........................... 714/795; 360/39; 714/796; 714/824
[58] Field of Search .................................. 371/43.7, 43.8, 371/71; 714/795, 796, 824; 360/39

[56] References Cited

U.S. PATENT DOCUMENTS

| | | | |
|---|---|---|---|
| 4,583,078 | 4/1986 | Shenoy et al. | 340/347 DD |
| 4,646,305 | 2/1987 | Tretter et al. | 371/43 |
| 4,918,446 | 4/1990 | Yagi | 341/94 |
| 4,924,225 | 5/1990 | Dingwall et al. | 341/118 |
| 4,968,990 | 11/1990 | Kim | 341/159 |
| 5,181,209 | 1/1993 | Hagenauer et al. | 371/43 |
| 5,220,570 | 6/1993 | Lou et al. | 371/43 |
| 5,343,335 | 8/1994 | Hara | 360/45 |
| 5,390,198 | 2/1995 | Higgins | 371/43 |
| 5,420,893 | 5/1995 | Ward | 375/368 |
| 5,422,760 | 6/1995 | Abbott et al. | 360/46 |
| 5,434,886 | 7/1995 | Kazawa et al. | 375/262 |
| 5,521,945 | 5/1996 | Knudson | 375/341 |
| 5,544,177 | 8/1996 | Ishida | 371/43 |
| 5,548,600 | 8/1996 | Fredrickson et al. | 371/43 |

OTHER PUBLICATIONS

Lou et al., "An Instruction Set for a Programmable Signal Processor Dedicated to Viterbi Detection" 1991 VLSITSA, pp. 247–251, Dec. 1991.

Viterbi, A., "Error Bounds for Convolutional Codes and an Asymptotically Optimum Decoding Algorithm," IEEE Transactions on Information Theory, vol. IT–13, No. 2, Apr. 1967, pp. 260–269.

Forney, G., "The Viterbi Algorithm," Proceedings of the IEEE, vol. 16, no. 3, Mar. 1973, pp. 268–278.

*Primary Examiner*—Stephen M. Baker
*Attorney, Agent, or Firm*—Kirkpatrick & Lockhart LLP

[57] ABSTRACT

The present invention is directed to a detector circuit for detecting a binary data sequence from an input sequence of data. The detector circuit comprises a storage device for storing a plurality of values which correspond to the squared errors computed between all possible input values to the circuit and all possible noiseless responses. The storage device outputs certain of the stored values in response to the input sequence of data. The detector circuit also comprises a Viterbi circuit responsive to the storage device. The Viterbi circuit computes a binary decision output from the outputted stored values. The present invention is also directed to a method for detecting a binary data sequence from an input sequence of data.

47 Claims, 7 Drawing Sheets

VITERBI DETECTOR WITH A PIPELINED LOOK-UP TABLE OF SQUARED ERRORS

CROSS REFERENCE TO RELATED APPLICATIONS (Not Applicable)

STATEMENT REGARDING FEDERALLY SPONSORED RESEARCH (Not Applicable)

BACKGROUND OF THE INVENTION

1. Field of the Invention

The present invention is directed generally to Viterbi detectors, and, more particularly, to a detector circuit with a pipelined look-up of squared errors.

2. Description of the Background

In magnetic recording devices, digital data is converted into a signal that is recorded by a write head on a magnetic medium, such as a computer disk or a magnetic-coated tape. When the data is read from the magnetic medium by a read head, the data is distorted due to the presence of additive white Gaussian noise, jitter, and intersymbol interference (ISI). These distortions may also be present in a waveform that is transmitted through a communication channel for demodulation, equalization and detection by a receiver.

A reproduction equalizer is typically employed in magnetic recording systems and communication channels to shape the received waveform such that the effects of distortion due to noise and ISI are minimized. In addition, equalization can be used to shape the overall channel response to have a controlled nonzero ISI. A common type of detector used for decoding the transmitted symbols after they are corrupted by a controlled ISI pattern and noise is a Viterbi detector. A Viterbi detector employs the Viterbi Algorithm, which was first proposed as an algorithm for decoding convolutional codes in A. J. Viterbi, "Error Bounds for Convolutional Codes and an Asymptotically Optimum Decoding Algorithm", IEEE Trans. Inform. Theory, Vol. IT-13, No. 2, pp. 260–69, April 1967. A seminal discussion of the merits of the application of the Viterbi Algorithm to digital communications signal detection can be found in G. D. Forney, "The Viterbi Algorithm", Proceedings of the IEEE, Vol. 61, No. 3, pp. 268–78, March 1973.

After equalization, the overall magnetic recording channel functions like a convolutional coder. One common equalization target for the controlled ISI is called partial response ("PR") coding. PR coding is a type of convolutional coding in which one of a number of output signals is chosen in response to each bit of input data. The choice is made based on the current state of the encoder and the input bit. Thus, the input data is distributed over a greater number of symbols when encoded. A Viterbi detector must be able to determine whether the data sequence that is received is the same as the sequence that was encoded by the PR encoder.

A common Viterbi detection routine, termed "maximum likelihood" ("ML") detection, uses a trellis arrangement to compare a received sequence of data with all possible permitted outcomes of the data by examining the distances along paths in the trellis of the values of the reproduced signals assuming no noise (target values) with respect to the actual received sequence. The trellis is arranged such that a traverse of the nodes and edges of the trellis represents one or more responses of the PR encoder to a sequence of input data. The distance traversed is defined as the minimum sum of the squared differences between sequences of signals assuming no noise (target values) and the actual received sequence. The minimum sum of the squared differences results from two paths that diverge from a common state on a trellis and converge to a common state.

A Viterbi detector uses the maximum likelihood trellis arrangement by projecting the possible states of the encoder onto the trellis. The detector traverses the paths through the trellis and selects the paths with the smallest cumulative distance, which are the most likely, or probable, paths. The paths that are less likely are discarded.

It is typical for a Viterbi detector to select a short, noiseless PR target of length N and to equalize the data storage channel to match the target because the number of trellis nodes is $2^{N-1}$. To eliminate the squaring, the target is usually chosen to have values of 0, +1, −1, +2, or −2. If the noiseless values are from the set $\{-2, -1, 0, 1, 2\}$, then a simplification for computing and comparing squared errors can be realized by removing the input signal squared term common to all squared errors at a given sample time. In this way, the squaring of the difference is reduced to a shift and an add or a subtract. In that case each trellis node requires only an add/compare/select ("ACS") unit. Because of the simplicity of the targets, they can be built into the ACS unit of the Viterbi detector with little or no penalty in speed or die area. However, there is a penalty in terms of error rate that is caused by using a linear equalizer to force the binary data storage channel response to fit into the target response. The use of generalized target values for the trellis requires a large number of computations, including multiplications, by the detector circuit such that it is difficult to operate such detectors in real time.

Therefore, there is a need for a detector circuit that uses generalized target values for the trellis and can thus adapt to the natural response of the actual binary data storage channel with little or no penalty in speed or die area. It would even be desirable to have these generalized response values be a nonlinear function of the N transmitted symbols. Such a detector circuit will require less equalization and result in a lower error rate.

SUMMARY OF THE INVENTION

The present invention, according to its broadest implementation, is directed to a detector circuit for detecting a binary data sequence from a stored input sequence of data. The detector circuit comprises a storage device for storing a plurality of values which correspond to the squared errors computed between all possible input values to the circuit and all possible noiseless responses. The storage device outputs certain of the stored values in response to the input sequence of data. The detector circuit also comprises a Viterbi circuit responsive to the storage device. The Viterbi circuit computes a binary decision output from the readback signal generated by the stored values.

The present invention also contemplates a binary data storage or communication channel with a detector circuit constructed according to the teachings of the present invention. The present invention further contemplates a magnetic data recording system with a detector circuit constructed according to the teachings of the present invention.

The present invention also contemplates a method for detecting a binary data sequence from an input sequence of data. The method comprises the step of retrieving a plurality of values from a storage device in response to the input sequence of data. The values correspond to the squared errors computed between all possible input values and all possible noiseless responses. The method also comprises the step of computing a binary decision output using a Viterbi Algorithm in response to the plurality of retrieved values.

The present invention represents a substantial advance over prior detector circuits. Because the present invention incorporates a look-up table of squared errors for generalized target values, the present invention has the advantage that it can adapt to the natural response of the actual binary channel. The present invention has the further advantage that it can use generalized target values that are closer to the natural response of the actual binary channel with little or no penalty in speed or die area. The present invention also has the advantage that the use of a look-up table with stored squared errors can compensate for non-linear intersymbol interference. The present invention also contemplates use of a pipelined implementation so that the delay time associated with the look-up table is not part of the delay of the Viterbi ACS unit. Those advantages and benefits of the present invention, and others, will become apparent from the Detailed Description of the Invention hereinbelow.

BRIEF DESCRIPTION OF THE DRAWINGS

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, many other elements found in a typical detector circuit. Those of ordinary skill in the art will recognize that other elements are desirable and/or required to implement the present invention. However, because such elements are well known in the art, and because they do not facilitate a better understanding of the present invention, a discussion of such elements is not provided herein.

Figure 1A:
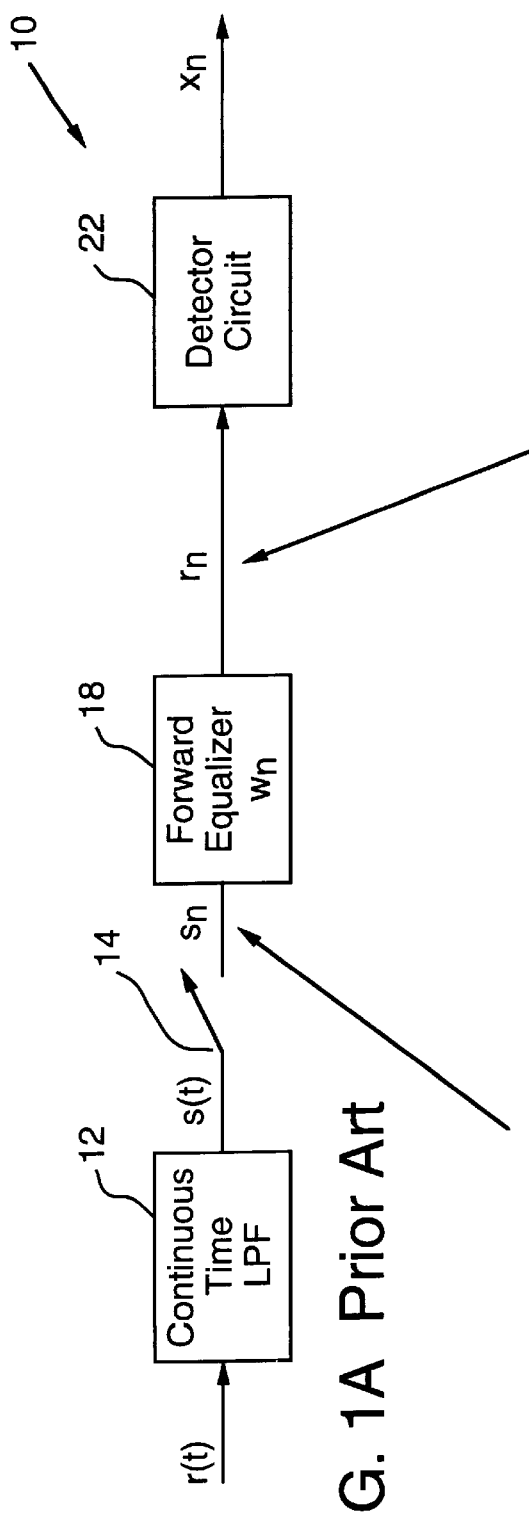
FIG. 1A illustrates an example of a portion of a prior art binary storage channel.

FIG. 1A illustrates an example of a portion of a prior art binary storage channel 10. An analog signal r(t) is input to the channel 10. The signal r(t) is generated by, for example, a disk drive read head followed by a preamplifier. The signal r(t) is input to a continuous time low pass filter 12. The filter 12 is typically an anti-aliasing filter that produces a filtered signal s(t). The signal s(t) is sampled by a sampling device 14 to produce a sampled pulse signal sn.

Figure 1C:
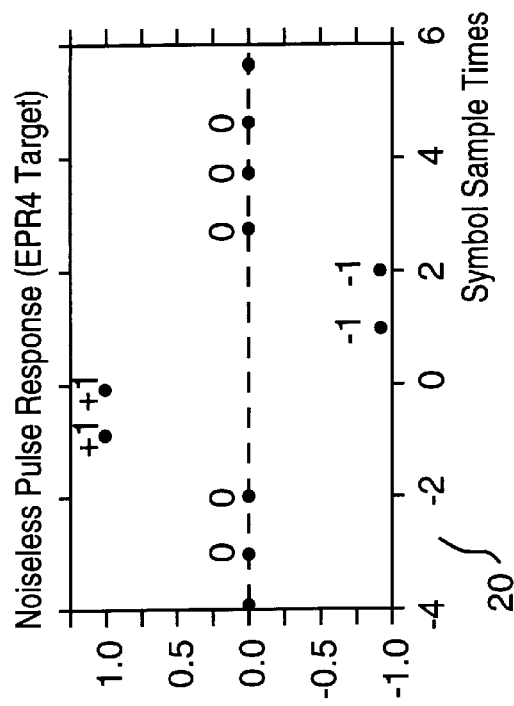
FIGS. 1B and 1C illustrate pulse responses before and after the forward equalizer, respectively.
Figure 1B:
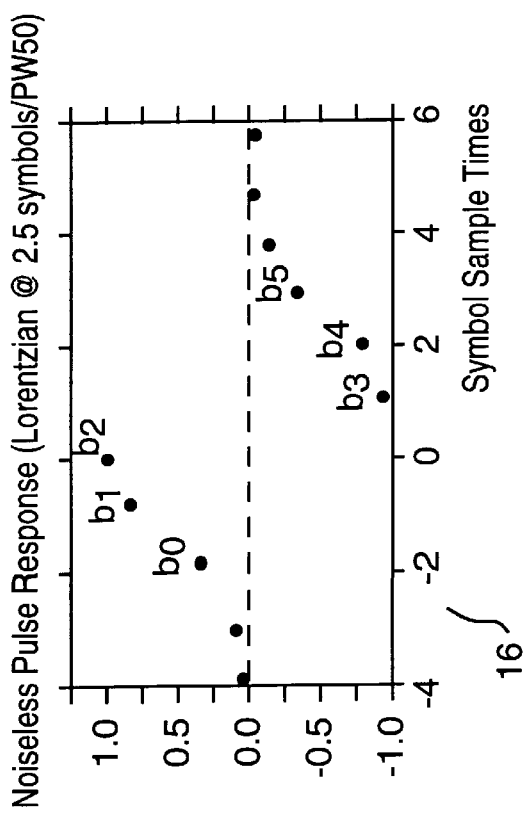

The noiseless pulse response 16 of the sampled signal sn is illustrated in FIG. 1B as a function of the symbol sample times. The sampled signal $s_n$ is input to a forward equalizer 18 to produce a pulse signal $r_n$. The equalizer 18 can be, for example, an IIR filter or an FIR filter. The equalizer 18 shapes the signal $r_n$ to "slim" it, i.e., to $r_n$ to decrease the extent of the intersymbol interference of the signal and to force the nonzero values to selected target noiseless values. The noiseless pulse response 20 of the signal $r_n$ is illustrated in FIG. 1C as a function of the symbol sample times. In a typical equalizer, the noiseless targets, as shown in FIG. 1C, are chosen to have values of −1, +1, and 0. The pulse signal $r_n$ is input to a detector circuit 22, which typically includes a circuit that uses a variation of the Viterbi Algorithm. The circuit which uses the Viterbi Algorithm typically has the noiseless targets built into the add/compare/select circuits.

Figure 2A:
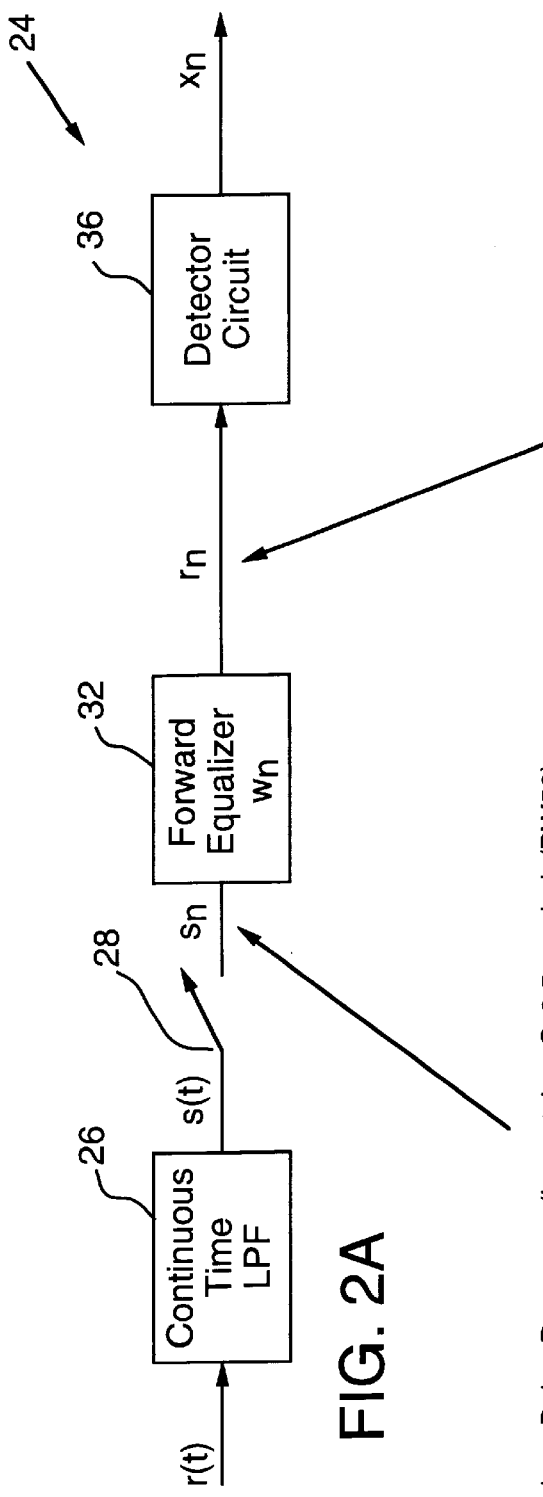
FIG. 2A illustrates a preferred embodiment of a portion of a binary storage channel of the present invention.

FIG. 2A illustrates a preferred embodiment of a portion of a binary channel 24 of the present invention. As in FIG. 1A, an analog signal r(t) is input to the channel 24. The signal r(t) is input to a continuous time low pass filter 26. The filter 26 can be, for example, an anti-aliasing filter that produces a filtered signal s(t). The signal s(t) is sampled by a sampling device 28 to produce a sampled pulse signal $s_n$.

Figure 2C:
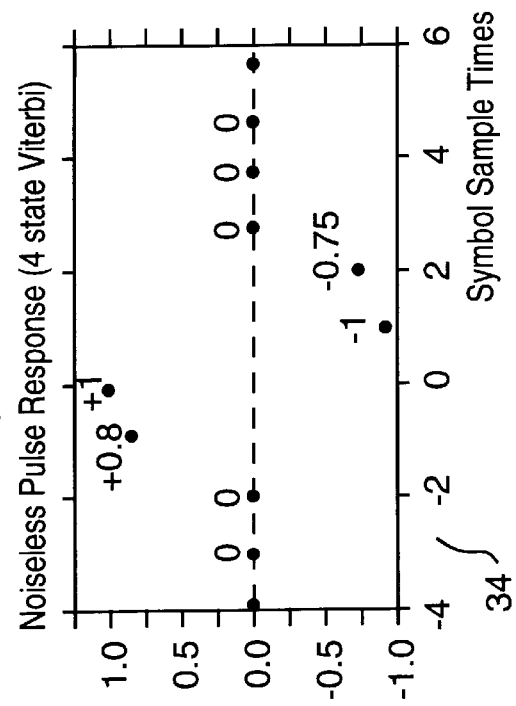
FIGS. 2B and 2C illustrate pulse responses before and after the forward equalizer, respectively.
Figure 2B:
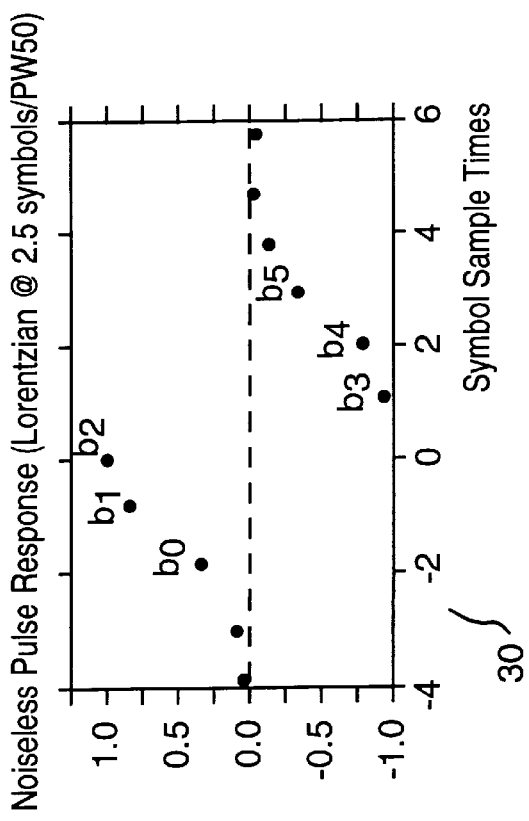

The noiseless pulse response 30 of the sampled signal $s_n$, as illustrated in FIG. 2B as a function of the symbol sample times, is identical to the pulse response in FIG. 1B. The sampled signal $s_n$ is input to a forward equalizer 32 to produce a pulse signal $r_n$. The equalizer 32 can be, for example, an IIR filter or an FIR filter. As in FIG. 1A, the equalizer 32 limits the number of nonzero ISI samples of the pulse signal $r_n$. The noiseless pulse response 34 of the signal $r_n$ is illustrated in FIG. 2C as a function of the symbol sample times. As can be seen in FIG. 2C, the noiseless targets have a better match to the actual channel than the match shown in FIG. 1C. The better match results in a simpler circuit structure for the equalizer 32. The better match also results in less noise gain, resulting in a lower error rate by a detector circuit 36.

Figure 3A:
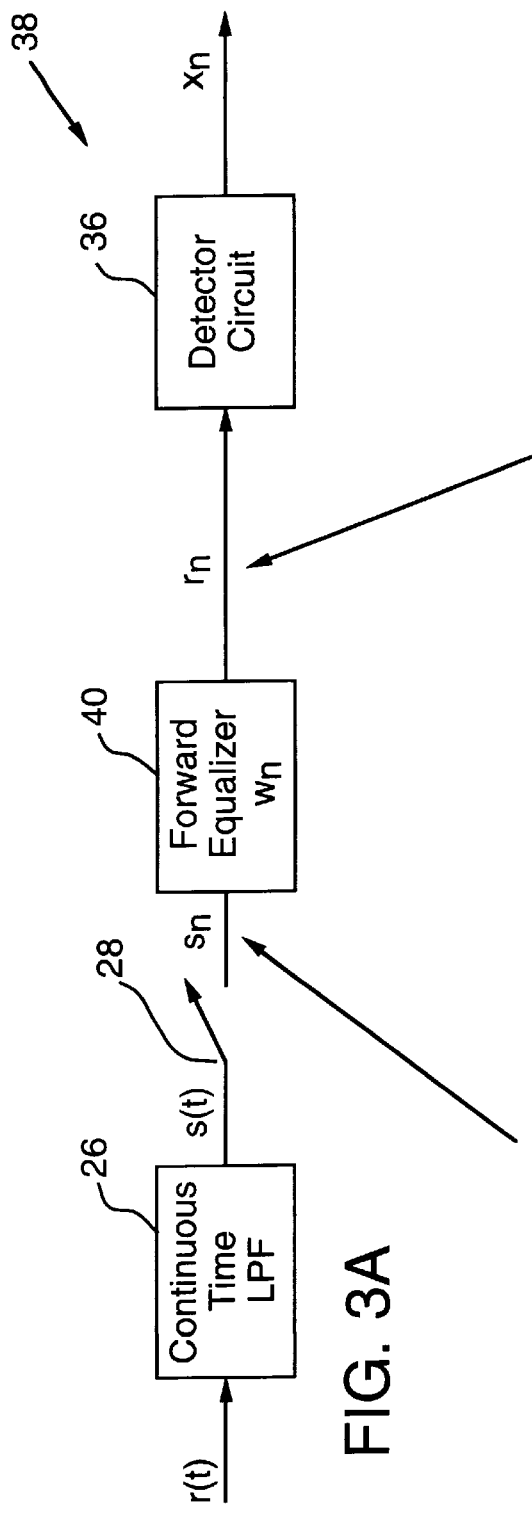
FIG. 3A illustrates a preferred embodiment of a portion of a binary storage channel of the present invention.
Figure 3C:
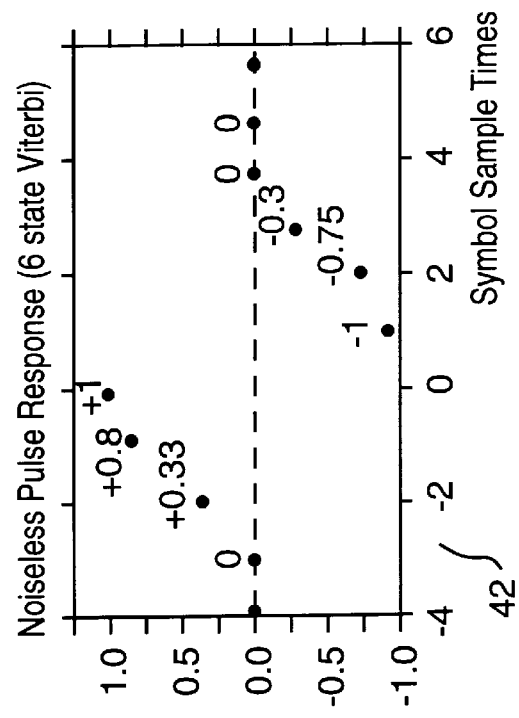
FIGS. 3B and 3C illustrate pulse responses before and after the forward equalizer, respectively.
Figure 3B:
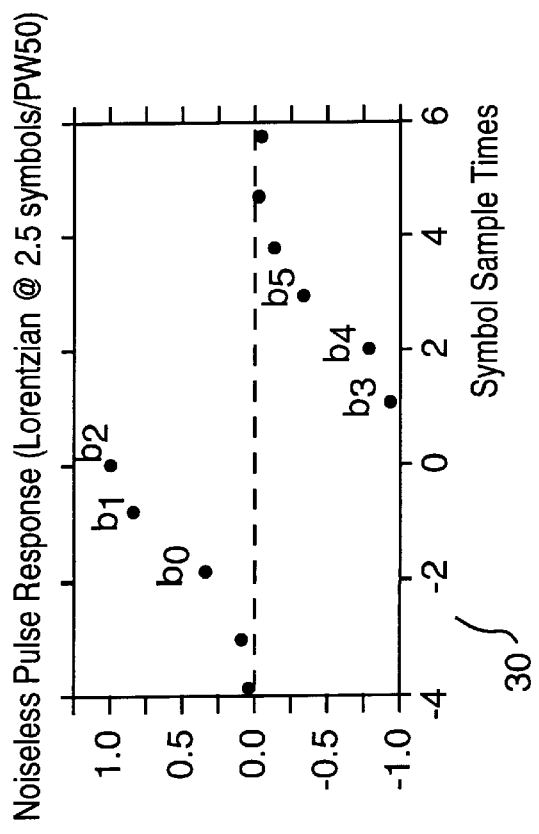

FIG. 3A illustrates a preferred embodiment of the present invention. A binary channel 38 is constructed similarly to the binary channel 24 of FIG. 2A. However, an equalizer 40 provides a further refined match of the target to the $r_n$ signal by extending to more nonzero ISI samples, which results in a lower error rate by the detector circuit 36. The noiseless response 42 can be seen in FIG. 3C.

Figure 4A:
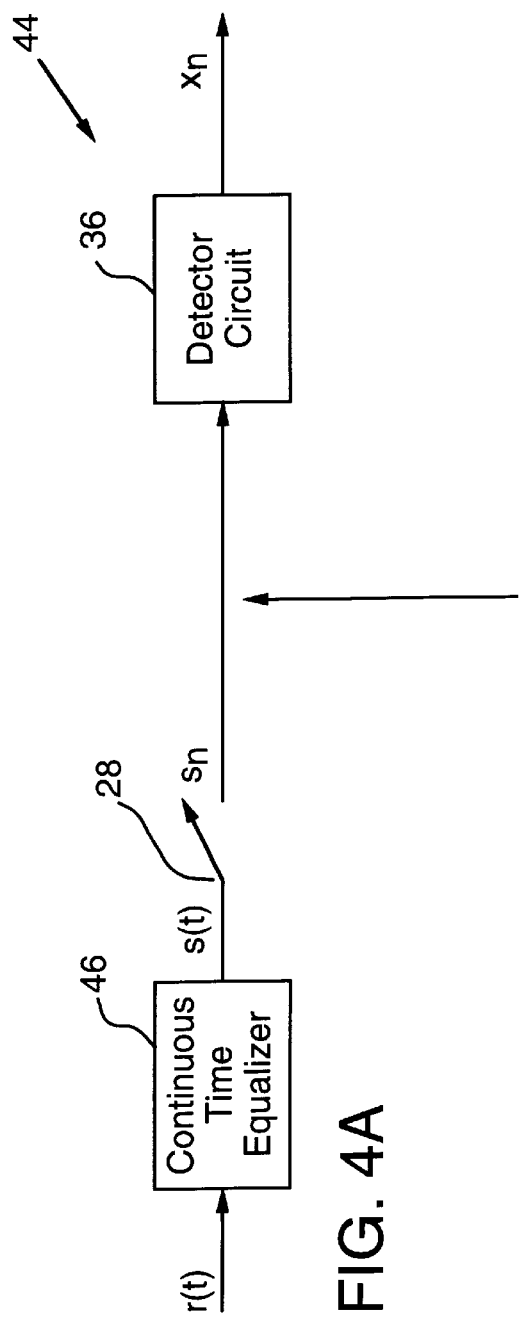
FIG. 4A illustrates a preferred embodiment of a portion of a binary storage channel of the present invention.
Figure 4B:
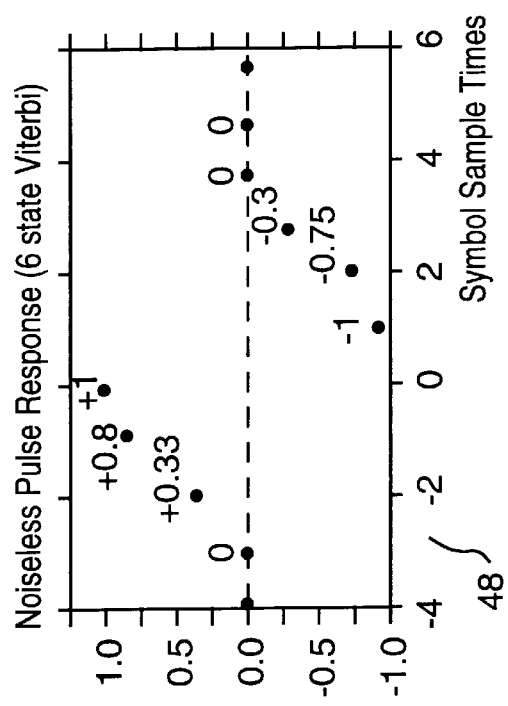
FIG. 4B illustrates a pulse response after the continuous time equalizer.

FIG. 4A illustrates another preferred embodiment of the present invention. A binary channel 44 is constructed similarly to the binary channel 24 of FIG. 2A and the binary channel 38 of FIG. 3A. However, due to the reduced requirements of generating the target noiseless pulse responses, the forward equalizer is greatly simplified and may be merged with the function of the low pass filter. Thus, a continuous time equalizer 46 filters the analog signal r(t) and shortens the extent of the ISI before sampling by the sampling device 28. In operation, the noiseless pulse response 48, as seen in FIG. 4B, is similar to that of FIG. 3C.

If the signal $r_n$ of FIGS. 2A, 3A, and 4A was input to a conventional detector circuit, the detector circuit would have to perform complex mathematical calculations, including multiplications, on the signal $r_n$, and the detector circuit's implementation would be different. The detector circuit would require complex circuitry that would consume large amounts of integrated circuit die area and power. Thus, the detector 36, in a preferred embodiment of the present invention, is capable of operating on the signal $r_n$ with little or no performance penalty. Also, the detector 36, in a preferred embodiment, is constructed such that a small amount of additional die area is consumed by the added circuitry.

Figure 5:
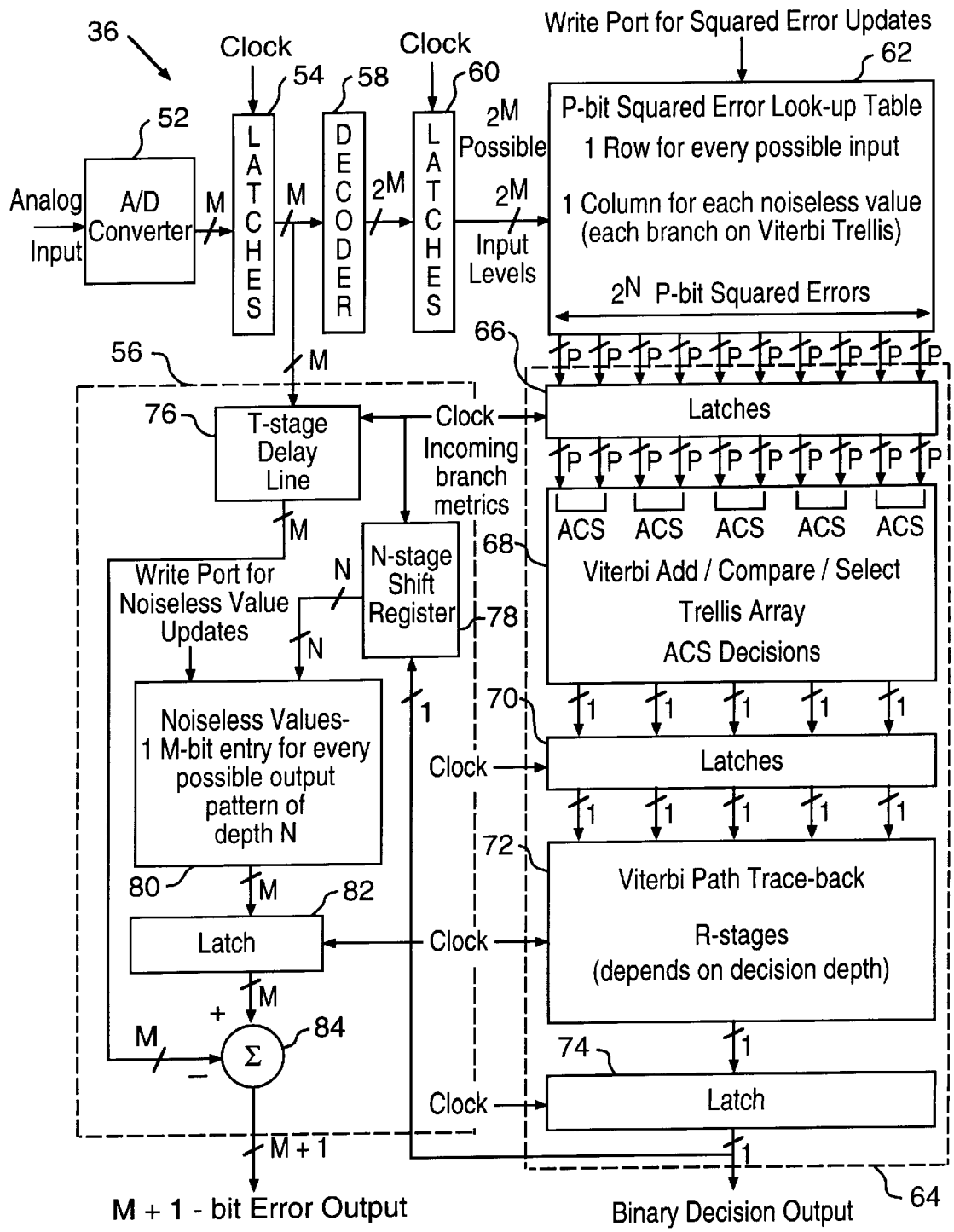
FIG. 5 illustrates a preferred embodiment of a detector circuit of the present invention.

FIG. 5 illustrates a preferred embodiment of the detector circuit 36. The detector circuit 36 could be used in the binary channel as illustrated in FIGS. 2A, 3A, or 4A, or in a prior art binary channel, such as that illustrated in FIG. 1A. An M-bit binary number, which is input to the circuit 36, is generated by an analog to digital (A/D) converter 52 directly. However, it can be understood by those skilled in the art that the M-bit binary number may also be the output of an equalizer which has a digital filter circuit. In such an arrangement, the A/D converter 52 would convert the signal before the digital equalizer.

The input signal is converted to an M-bit number. M is typically on the order of 5 to 6 bits. The M-bit number is latched into latches 54. The outputs of the latches 54 are connected to an error output circuit 56 and a decoder circuit 58. The decoder circuit 58 decodes the M-bit number into $2^M$ signals, only one of which is high. The high signal corresponds to the binary number indicated by the M-bit number. The outputs of the decoder circuit 58 are connected to latches 60. The latches 60 operate to pipeline the decoding operation and thus remove the delay due to the decoding operation from subsequent operations. However, the latches 60 may be omitted if it is desired that the decoding operation not be pipelined.

The decoded $2^M$ signals at the output of the latches 60 are available as inputs to a storage device 62. The storage device 62 operates as a look-up table in which the resulting squared error computations between all possible input values, of which there are $2^M$ possible values, and all possible noiseless responses, of which there are $2^N$ possible values, where N is the number of non-zero ISI terms remaining at the input to the detector circuit, are stored. For example, for a detector circuit that is constructed for an ISI pattern that is 4 symbols in length, there will be 16 possible noiseless values.

The squared errors are stored as P-bit numbers in the storage device 62. Typical values for P are 4 to 6 bits. The values in the storage device 62 are arranged in rows and columns such that the signals from the decoder circuit 58 are used as addresses to determine a row of values to be read from the storage device. Each row contains the squared error between the storage device 62 input value, or address, and every one of $2^N$ possible noiseless outputs. Thus, there is one column for each noiseless value, or, in Viterbi Algorithm terminology, for each branch of a Viterbi trellis. $P2^N$ bits are therefore simultaneously read out of the storage device 62 for each input symbol.

The storage device 62 may be any type of conventional memory device known in the art. For example, the storage device 62 may be a random access memory (RAM), a read only memory (ROM), or a magnetic disk or tape device. In a preferred embodiment, the storage device 62 is a RAM with a write port and a read port. The input value is used to address the RAM through the read port and the write port can be used simultaneously or when the channel is idle, to update the values of the squared errors which are stored in the storage device 62. The stored values can be updated as necessary using the write port. For example, the stored values can be updated for each head, for each access to different zones of the magnetic recording medium from which the data is being read, etc.

The outputs of the storage device 62 are connected to a Viterbi circuit 64. The Viterbi circuit 64 can be can be of any type of circuit that implements any of a number of variations of the Viterbi Algorithm. A preferred embodiment of the Viterbi circuit 64, as shown in FIG. 5, is described hereinbelow.

The outputs of the storage device 62 are connected to a set of latches 66. The latches 66 act as a pipeline register. Thus, all of the squared error calculations have taken place in a pipelined manner and, other than an increase in the overall latency of the detector circuit 36 by 1 or 2 clock ticks, there is no adverse impact on the maximum clocking speed of the detector circuit 36. The latches 66 may be omitted from the Viterbi circuit 64 if it is desired that the Viterbi operation not be pipelined.

The outputs of the latches 66 are connected to a Viterbi add/compare/select ("ACS") circuit 68. In the preferred embodiment shown in FIG. 5, the ACS circuit 68 has an array of $2^{N-1}$ add/compare/select ("ACS") units. Each ACS unit is connected to and operates on the two squared errors associated with a node in the Viterbi trellis. The internal structure of the ACS circuit 68 must be such that accumulated path costs may be passed between the appropriate trellis nodes. The ACS decisions computed by the ACS circuit 68 are stored in a set of latches 70. The latches 70 may be omitted from the Viterbi circuit 64 if it is desired that the Viterbi operation not be pipelined.

The outputs of the latches 70, which correspond to the ACS decisions, are connected to a Viterbi path trace-back circuit 72. The Viterbi path trace-back circuit 72 traces back through the Viterbi trellis and computes a final decision of the value that was input to the storage device 62. The final decision is output from the Viterbi path trace-back circuit after R clock ticks, where R is the number of stages in the circuit 72. The number of stages in the circuit 72 is dependent on the decision depth of the Viterbi trellis. A typical value for R could range from 10 to 16. The final decision is latched into latch 74. The latch 74 may be omitted from the Viterbi circuit 64 if it is desired that the Viterbi operation not be pipelined. The final decision output appears at the output of the detector circuit 36 after R+3 clock ticks from the time the input value is presented to the storage device 62 in the embodiment shown in FIG. 5, in which the set of latches 66, the set of latches 70, and the latch 74 act as pipeline registers.

The error output circuit 56 operates to determine the error between the noiseless ideal input and the actual observed input to the detector. The error output signal from the error output circuit 56 is important for decision-directed timing circuits, decision-directed amplitude control circuits, decision-directed DC offset control, and least mean squares ("LMS") adaption of filter coefficients and noiseless values. It can be understood by those skilled in the art that the error output circuit 56 can be implemented using any type of error calculation circuit. However, a preferred embodiment, as illustrated in FIG. 5, is described hereinbelow.

A delay circuit 76 delays the input M-bit word by the appropriate number of clock ticks, which is R+3 in the pipelined implementation illustrated in FIG. 5, such that the current binary decision output bit corresponds to the appropriate input sample. An N-stage shift register 78 stores the current binary decision output and the previous N−1 binary decision output bits. Because the number of terms in the ISI is N, all that is needed is a block of N binary decision outputs to determine the noiseless value that should have been observed at the input to the detector.

The output of the shift register 78 indicates which noiseless value to subtract from the input value to determine the error output. The noiseless values are stored in a storage device 80. The storage device 80 stores the noiseless values as an array, which consists of one M-bit entry for every possible output pattern of depth N. The output of the shift register 78 acts as an address which determines which M-bit noiseless value appears at the output of the storage device 80. The contents of the storage device 80 should correspond to the squared error look-up table which is stored in the storage device 62.

The storage device 80 may be any type of conventional memory device. For example, the storage device 80 may be a random access memory (RAM), a read only memory (ROM), or a magnetic disk or tape device. In a preferred embodiment, the storage device 80 is a RAM with a write port and a read port. The M-bit value from the shift register 78 outputs is used to address the RAM through the read port and the write port can be used to update the values of the noiseless values to correspond to the values in the squared error look-up table that is stored in the storage device 62.

The noiseless value that is output from the storage device 80 is stored in a latch 82. The output of the latch 82 is connected to an adder circuit 84. The adder circuit 84 subtracts the noiseless value from the observed value to generate the error output signal. An alternative arrangement of the error output circuit 56 can be constructed such that the storage device 80 would store all errors that correspond to the input signal and the last N decision bits. Such an arrangement would require the elimination of the adder circuit 82 but would necessitate a larger storage device 80.

Figure 6:
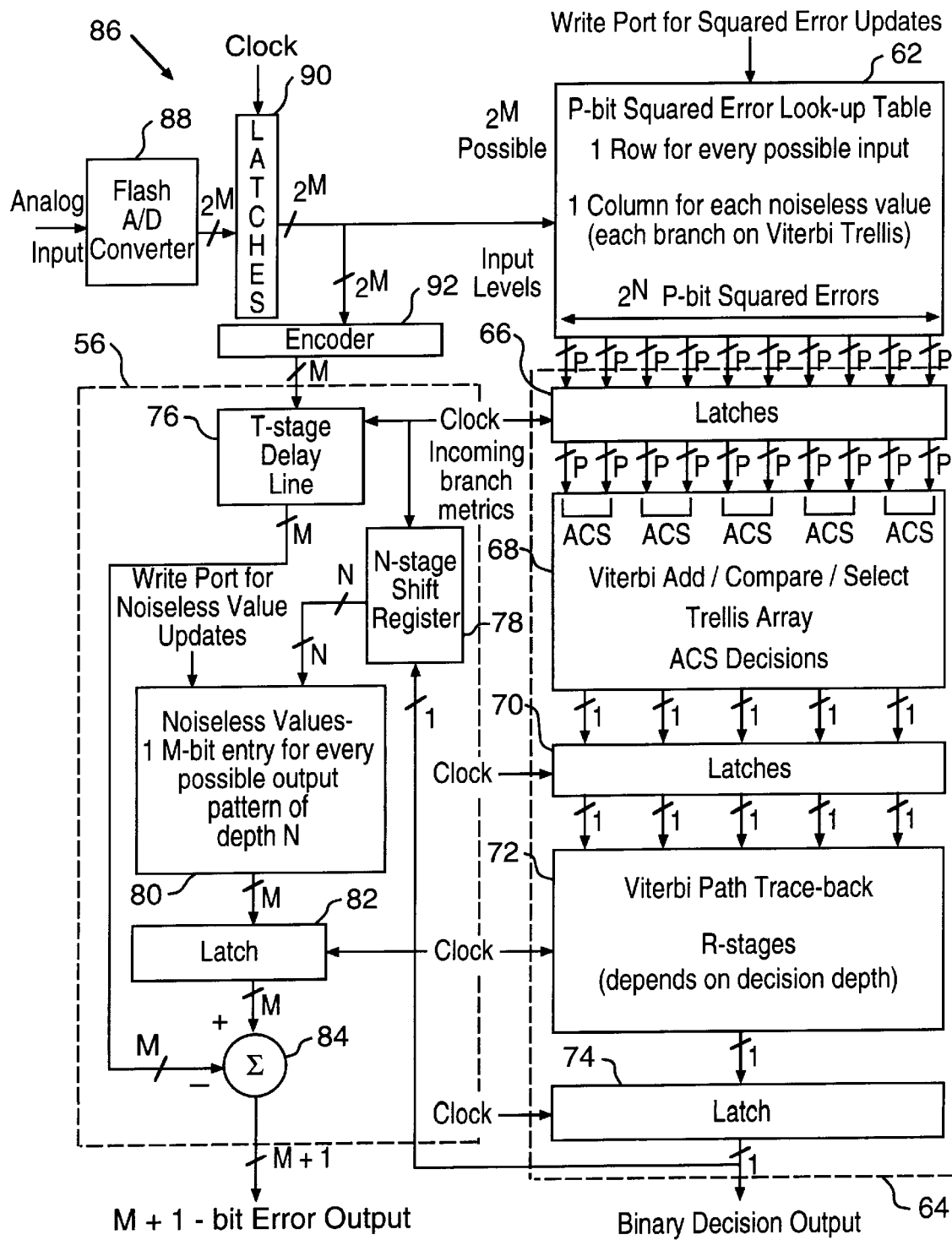
FIG. 6 illustrates another preferred embodiment of a detector circuit of the present invention.

FIG. 6 illustrates another preferred embodiment of a detector circuit 86. The detector circuit 86 could be used in place of the detector circuit 36 in FIGS. 2A, 3A, and 4A, or could be used in a prior art binary channel. A flash analog to digital ("A/D") converter circuit 88 accepts the analog input signal. The signals input to the A/D converter circuit 88 are converted to "thermometer" code, in which the signals that are below a threshold level are converted to "1's", and the signals that are above the threshold level are converted to "0's". The A/D converter circuit 88 converts the "1's" and "0's" into a one of $2^M$ signal in which the only line that is a "1" is at the point where the "thermometer" code transitions from a "1" to a "0". The outputs of the A/D converter circuit 88 are connected to a set of latches 90. The $2^M$ outputs of the A/D converter circuit 88 correspond to the outputs of the decoder circuit 58 of the preferred embodiment shown in FIG. 5. Thus, there is no need for a decoder circuit in the embodiment shown in FIG. 6. However, an encoder circuit 92 is needed to compress the $2^M$ outputs of the latches 90 to M signals for use in the error output circuit 56. In the implementation of the preferred embodiment shown in FIG. 6, the error output circuit 56, the storage device 62, and the Viterbi circuit 64 are constructed in an identical manner to those illustrated in FIG. 5.

Figure 7:
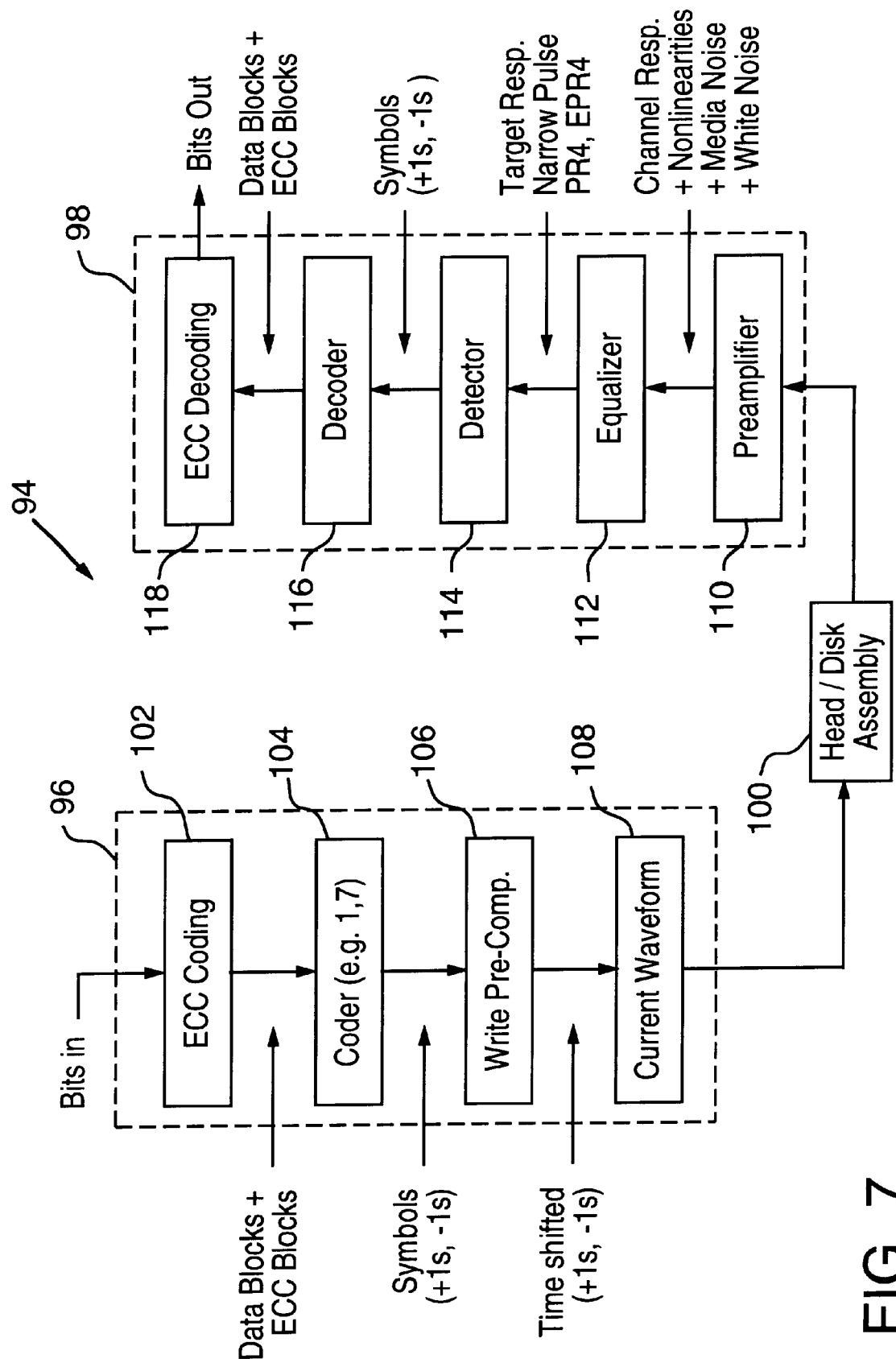
FIG. 7 illustrates a magnetic recording channel system in which the detector circuit of the present invention may be used.

FIG. 7 illustrates a magnetic recording channel system 94 in which the detector circuit of the present invention may be used. The system 94 includes a write circuit 96, a read circuit 98, and a head/disk assembly 100. The disk may be any type of magnetic recording medium that is known in the art, such as a hard disk or a tape with a magnetic coating. The head/disk assembly 100 may include a read/write head or may contain separate read and write heads.

The write circuit 96 functions to convert a sequence of data bits that are to be written onto a recording medium in the head/disk assembly 100. The sequence of bits that are to be written on the medium is input to an error correction code ("ECC") circuit 102. The outputs of the ECC circuit 102 represent data blocks and ECC blocks, which are input to a coder circuit 104. The coder circuit 104 outputs the data blocks and ECC blocks as coded symbols, such as, for example, symbols selected from the set of $\{+1,-1\}$. The symbols are input to a write pre-compress circuit 106, which time shifts the symbols. A current waveform circuit outputs a current waveform to the head/disk assembly, which is written by the head onto the magnetic medium.

The read circuit 98 operates to process information that is read from the head/disk assembly 100 and convert the information into a sequence of data bits that was originally input to the magnetic recording system 94. A preamplifier 110 operates similarly to the low pass filters 12 and 26 as shown in FIGS. 1A, 2A, and 3A to filter all but the channel response, any nonlinearities, any media noise, and any white noise from the signal that is read from the head/disk assembly 100. An equalizer 112 operates similarly to the equalizers 18 and 32 of FIGS. 1A, 2A, and 3A to limit the white noise bandwidth of the signal from the preamplifier 110 and to "slim" the pulse signal from the preamplifier 100 to decrease the intersymbol interference of the signal. A narrow target response pulse is generated by the equalizer 112.

A detector circuit 114, which is constructed as illustrated by the detector circuit 36 of FIG. 5 or the detector circuit 86 of FIG. 6, produces a binary decision output that is coded in symbols as a result of the coding operation of the coder circuit 104. A decoder circuit 116 decodes the symbols to produce binary data blocks and ECC blocks. An ECC decoding circuit 118 ensures that the ECC blocks indicate that no errors are present in the data bits. The binary bits that were originally input to the system 94 are available at the output of the ECC decoding circuit 118.

The present invention also contemplates a method for detecting a binary data sequence from an input sequence of data. The method, in its broadest form comprises the step of retrieving a plurality of values from a storage device in response to the input sequence of data. The values correspond to the squared errors computed between all possible input values and all possible noiseless responses. The method also comprises the step of computing a binary decision output using a Viterbi Algorithm in response to the plurality of retrieved values.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A detector circuit for detecting a data sequence from an input sequence of data, comprising:

a storage device for storing a plurality of values, said values corresponding to the squared errors computed between all possible input values to the circuit and all possible noiseless responses, said storage device outputting certain of said stored plurality of values in response to the input sequence of data, said storage device having a read port and a write port, said read port for reading said values corresponding to the squared errors and said write port for writing said values corresponding to the squared errors; and a Viterbi circuit responsive to said storage device, said Viterbi circuit for computing the data sequence.

2. The circuit of claim 1 wherein said storage device is a random access memory.

3. The circuit of claim 1 wherein said storage device is a read only memory.

4. The circuit of claim 1 wherein said storage device is a magnetic recording medium.

5. The circuit of claim 1 further comprising:
an analog to digital converter circuit responsive to the input data sequence;
a first plurality of latches responsive to said analog to digital converter circuit;
a decoder circuit responsive to said first plurality of latches, said decoder circuit for decoding the input sequence of data; and
a second plurality of latches responsive to said decoder circuit, the outputs of said second plurality of latches connected to said storage device.

6. The circuit of claim 1 further comprising:
a flash analog to digital converter circuit responsive to the input data sequence;
a plurality of latches responsive to the input data sequence, the outputs of said latches connected to said storage device; and
an encoder circuit responsive to the outputs of said latches.

7. The circuit of claim 1 wherein said Viterbi circuit comprises:
a Viterbi add/compare/select circuit responsive to said storage device, said add/compare/select circuit for computing a plurality of acs decisions; and
a Viterbi trace-back circuit responsive to said Viterbi add/compare/select circuit, said Viterbi trace-back circuit for computing the data sequence.

8. The circuit of claim 7 further comprising a plurality of latches responsive to said storage device, the output of said latches connected to said Viterbi add/compare/select circuit, said latches for pipelining said squared errors to said Viterbi add/compare/select circuit.

9. The circuit of claim 8 further comprising a second plurality of latches responsive to said Viterbi add/compare/select circuit, the output of said second latches connected to said Viterbi trace-back circuit.

10. The circuit of claim 9 further comprising a latch, said latch responsive to said Viterbi trace-back circuit.

11. The circuit of claim 1 further comprising an error output circuit, said error output circuit responsive to the input sequence of data and said Viterbi circuit, said circuit for producing an error output value.

12. The circuit of claim 11 wherein said error output circuit comprises:
a second storage device responsive to the input sequence of data and said Viterbi circuit, said second storage device for storing a plurality of values, said values representing a plurality of possible output patterns of noiseless values;
a delay circuit for producing a delayed input value from the input sequence of data; and
a circuit responsive to said second storage device and said delay circuit, said circuit for subtracting said delayed input value from a noiseless value selected from said second storage device to produce an error output.

13. The circuit of claim 12 further comprising:
a shift register responsive to said Viterbi circuit, the output of said shift register connected to said second storage device; and a latch responsive to said second storage device, the output of said latch connected to said circuit.

14. A detector circuit for detecting a data sequence from an input sequence of data, comprising:
a magnetic recording medium for storing a plurality of values, said values corresponding to the squared errors computed between all possible input values to the circuit and all possible noiseless responses, said magnetic recording medium outputting certain of said stored plurality of values in response to the input sequence of data; and
a Viterbi circuit responsive to said magnetic recording medium, said Viterbi circuit for computing the data sequence.

15. The circuit of claim 14 further comprising:
an analog to digital converter circuit responsive to the input data sequence;
a first plurality of latches responsive to said analog to digital converter circuit;
a decoder circuit responsive to said first plurality of latches, said decoder circuit for decoding the input sequence of data; and
a second plurality of latches responsive to said decoder circuit, the outputs of said second plurality of latches connected to said magnetic recording medium.

16. The circuit of claim 14 further comprising:
a flash analog to digital converter circuit responsive to the input data sequence;
a plurality of latches responsive to the input data sequence, the outputs of said latches connected to said magnetic recording medium; and
an encoder circuit responsive to the outputs of said latches.

17. The circuit of claim 14 further comprising an error output circuit, said error output circuit responsive to the input sequence of data and said Viterbi circuit, said circuit for producing an error output value.

18. The circuit of claim 17 wherein said error output circuit comprises:
a storage device responsive to the input sequence of data and said Viterbi circuit, said storage device for storing a plurality of values, said values representing a plurality of possible output patterns of noiseless values;
a delay circuit for producing a delayed input value from the input sequence of data; and
a circuit responsive to said storage device and said delay circuit, said circuit for subtracting said delayed input value from a noiseless value selected from said storage device to produce an error output.

19. The circuit of claim 18 further comprising:
a shift register responsive to said Viterbi circuit, the output of said shift register connected to said second storage device; and
a latch responsive to said storage device, the output of said latch connected to said circuit.

20. The circuit of claim 1 wherein said Viterbi circuit comprises:
a Viterbi add/compare/select circuit responsive to said magnetic recording medium, said add/compare/select circuit for computing a plurality of acs decisions; and
a Viterbi trace-back circuit responsive to said Viterbi add/compare/select circuit, said Viterbi trace-back circuit for computing the data sequence.

21. The circuit of claim 20 further comprising a plurality of latches responsive to said magnetic recording medium, the output of said latches connected to said Viterbi add/compare/select circuit, said latches for pipelining said squared errors to said Viterbi add/compare/selected circuit.

22. The circuit of claim 21 further comprising a second plurality of latches responsive to said Viterbi add/compare/select circuit, the output of said second latches connected to said Viterbi trace-back circuit.

23. The circuit of claim 22 further comprising a latch, said latch responsive to said Viterbi trace-back circuit.

24. A detector circuit for detecting a data sequence from an input sequence of data, comprising:

a storage device for storing a plurality of values, said values corresponding to the squared errors computed between all possible input values to the circuit and all possible noiseless responses, said storage device outputting certain of said stored plurality of values in response to the input sequence of data;

a Viterbi circuit responsive to said storage device, said Viterbi circuit for computing the data sequence;

an error output circuit, said error output circuit responsive to the input sequence of data and said Viterbi circuit, said circuit for producing an error output value, said error output circuit comprising:

a second storage device responsive to the input sequence of data and said Viterbi circuit, said second storage device for storing a plurality of values, said values representing a plurality of possible output patterns of noiseless values;

a delay circuit for producing a delayed input value from the input sequence of data; and a circuit responsive to said second storage device and said delay circuit, said circuit for subtracting said delayed input value from a noiseless value selected from said second storage device to produce an error output.

25. A detector circuit for detecting a data sequence from an input sequence of data, comprising:

a storage device for storing a plurality of values, said values corresponding to the squared errors computed between all possible input values to the circuit and all possible noiseless responses, said storage device outputting certain of said stored plurality of values in response to the input sequence of data;

a Viterbi circuit responsive to said storage device, said Viterbi circuit for computing the data sequence;

an error output circuit, said error output circuit responsive to the input sequence of data and said Viterbi circuit, said circuit for producing an error output value, said error output circuit comprising:

a second storage device responsive to the input sequence of data and said Viterbi circuit, said second storage device for storing a plurality of values, said values representing a plurality of possible output patterns of noiseless values;

a delay circuit for producing a delayed input value from the input sequence of data;

a circuit responsive to said second storage device and said delay circuit, said circuit for subtracting said delayed input value from a noiseless value selected from said second storage device to produce an error output;

a shift register responsive to said Viterbi circuit, the output of said shift register connected to said second storage device; and a latch responsive to said second storage device, the output of said latch connected to said circuit.

26. A combination, comprising:

a filter for filtering an analog input signal to produce a filtered signal;

a sampling circuit responsive to said filter, said sampling circuit for producing a sampled signal from the filtered signal;

a forward equalizer responsive to said sampling circuit, said forward equalizer for producing a target response signal from said sampled signal; and a detector circuit responsive to said forward equalizer, said detector circuit comprising:

a storage device for storing a plurality of values, said values corresponding to the squared errors computed between all possible input values to the circuit and all possible noiseless responses, said storage device outputting certain of said stored plurality of values in response to an input sequence of data;

a Viterbi circuit responsive to said storage device, said Viterbi circuit for computing a binary decision output; and an error output circuit responsive to the input sequence of data and said Viterbi circuit, said circuit for producing an error output value, said circuit comprising:

a second storage device responsive to the input sequence of data and said Viterbi circuit, said second storage device for storing a plurality of values, said values representing a plurality of possible output patterns of noiseless values;

a delay circuit for producing a delayed input value from the input sequence of data; and a circuit responsive to said second storage device and said delay circuit, said circuit for subtracting said delayed input value from a noiseless value selected from said second storage device to produce an error output.

27. A combination, comprising:

a filter for filtering an analog input signal to produce a filtered signal;

a sampling circuit responsive to said filter, said sampling circuit for producing a sampled signal from the filtered signal;

a forward equalizer responsive to said sampling circuit, said forward equalizer for producing a target response signal from said sampled signal; and a detector circuit responsive to said forward equalizer, said detector circuit comprising:

a storage device for storing a plurality of values, said values corresponding to the squared errors computed between all possible input values to the circuit and all possible noiseless responses, said storage device outputting certain of said stored plurality of values in response to an input sequence of data, said storage device having a read port and a write port, said read port for reading said values corresponding to the squared errors and said write port for writing said values corresponding to the squared errors; and a Viterbi circuit responsive to said storage device, said Viterbi circuit for computing a binary decision output.

28. The combination of claim 27 wherein said detector circuit further comprises an error output circuit, said error output circuit responsive to the input sequence of data and said Viterbi circuit, said circuit for producing an error output value.

29. The combination of claim 28 wherein said error output circuit comprises:

a second storage device responsive to the input sequence of data and said Viterbi circuit, said second storage device for storing a plurality of values, said values representing a plurality of possible output patterns of noiseless values;

a delay circuit for producing a delayed input value from the input sequence of data; and a circuit responsive to said second storage device and said delay circuit, said circuit for subtracting said delayed input value from a noiseless value selected from said second storage device to produce an error output.

30. A combination, comprising:

a filter for filtering an analog input signal to produce a filtered signal;

a sampling circuit responsive to said filter, said sampling circuit for producing a sampled signal from the filtered signal;

a forward equalizer responsive to said sampling circuit, said forward equalizer for producing a target response signal from said sampled signal; and a detector circuit responsive to said forward equalizer, said detector circuit comprising:

a magnetic recording medium for storing a plurality of values, said values corresponding to the squared errors computed between all possible input values to the circuit and all possible noiseless responses, said magnetic recording medium outputting certain of said stored plurality of values in response to an input sequence of data; and a Viterbi circuit responsive to said storage device, said Viterbi circuit for computing a binary decision output.

31. The combination of claim 30 wherein said detector circuit further comprises an error output circuit, said error output circuit responsive to the input sequence of data and said Viterbi circuit, said circuit for producing an error output value.

32. The combination of claim 31 wherein said error output circuit comprises:

a storage device responsive to the input sequence of data and said Viterbi circuit, said storage device for storing a plurality of values, said values representing a plurality of possible output patterns of noiseless values;

a delay circuit for producing a delayed input value from the input sequence of data; and a circuit responsive to said storage device and said delay circuit, said circuit for subtracting said delayed input value from a noiseless value selected from said storage device to produce an error output.

33. A combination, comprising:

a continuous time equalizer for filtering an input analog signal and generating a target response signal;

a sampling circuit responsive to said continuous time equalizer, said sampling circuit for producing a sampled signal from the target response signal; and a detector circuit responsive to said sampling circuit, said detector circuit comprising:

a storage device for storing a plurality of values, said values corresponding to the squared errors computed between all possible input values to the circuit and all possible noiseless responses, said storage device outputting certain of said stored plurality of values in response to an input sequence of data;

a Viterbi circuit responsive to said storage device, said Viterbi circuit for computing a binary decision output; and an error output circuit, said error output circuit responsive to the input sequence of data and said Viterbi circuit, said circuit for producing an error output value, said circuit comprising:

a second storage device responsive to the input sequence of data and said Viterbi circuit, said second storage device for storing a plurality of values, said values representing a plurality of possible output patterns of noiseless values;

a delay circuit for producing a delayed input value from the input sequence of data; and a circuit responsive to said second storage device and said delay circuit, said circuit for subtracting said delayed input value from a noiseless value selected from said second storage device to produce an error output.

34. A combination, comprising;

a continuous time equalizer for filtering an input analog signal and generating a target response signal;

a sampling circuit responsive to said continuous time equalizer, said sampling circuit for producing a sampled signal from the target response signal; and a detector circuit responsive to said sampling circuit, said detector circuit comprising:

a storage device for storing a plurality of values, said values corresponding to the squared errors computed between all possible input values to the circuit and all possible noiseless responses, said storage device outputting certain of said stored plurality of values in response to an input sequence of data, and said storage device having a read port and a write port, said read port for reading said values corresponding to the squared errors and said write port for writing said values corresponding to the squared errors; and a Viterbi circuit responsive to said storage device, said Viterbi circuit for computing a binary decision output.

35. The combination of claim 34 wherein said detector circuit further comprises an error output circuit, said error output circuit responsive to the input sequence of data and said Viterbi circuit, said circuit for producing an error output value.

36. The combination of claim 35 wherein said error output circuit comprises:

a second storage device responsive to the input sequence of data and said Viterbi circuit, said second storage device for storing a plurality of values, said values representing a plurality of possible output patterns of noiseless values;

a delay circuit for producing a delayed input value from the input sequence of data; and a circuit responsive to said second storage device and said delay circuit, said circuit for subtracting said delayed input value from a noiseless value selected from said second storage device to produce an error output.

37. A combination, comprising:

a continuous time equalizer for filtering an input analog signal and generating a target response signal;

a sampling circuit responsive to said continuous time equalizer, said sampling circuit for producing a sampled signal from the target response signal; and a detector circuit responsive to said sampling circuit, said detector circuit comprising;

a magnetic recording medium for storing a plurality of values, said values corresponding to the squared errors computed between all possible input values to the circuit and all possible noiseless responses, said magnetic recording medium outputting certain of said stored plurality of values in response to an input sequence of data; and a Viterbi circuit responsive to said magnetic recording medium, said Viterbi circuit for computing a binary decision output.

38. The combination of claim 37 wherein said detector circuit further comprises an error output circuit, said error output circuit responsive to the input sequence of data and said Viterbi circuit, said circuit for producing an error output value.

39. The combination of claim 38 wherein said error output circuit comprises:

a storage device responsive to the input sequence of data and said Viterbi circuit, said storage device for storing a plurality of values, said values representing a plurality of possible output patterns of noiseless values;

a delay circuit for producing a delayed input value from the input sequence of data; and a circuit responsive to said storage device and said delay circuit, said circuit for subtracting said delayed input value from a noiseless value selected from said storage device to produce an error output.

40. A magnetic data recording system having a head/disk assembly, comprising:

a write circuit for converting a sequence of data bits that are to be written onto a recording medium in the head/disk assembly to a recording signal;

a preamplifier for filtering a signal that is read from the recording medium;

an equalizer responsive to said preamplifier, said equalizer for producing a target response signal from said filtered signal;

a detector circuit responsive to said equalizer, said detector circuit comprising:

a storage device for storing a plurality of values, said values corresponding to the squared errors computed between all possible input values to the detector circuit and all possible noiseless responses, said storage device outputting certain of said stored plurality of values in response to the input sequence of data;

a Viterbi circuit responsive to said storage device, said Viterbi circuit for computing a binary decision output; and an error output circuit responsive to the input sequence of data and said Viterbi circuit, said circuit for producing an error output value, said circuit comprising:

a second storage device responsive to the input sequence of data and said Viterbi circuit, said second storage device for storing a plurality of values, said values representing a plurality of possible output patterns of noiseless values;

a delay circuit for producing a delayed input value from the input sequence of data; and a circuit responsive to said second storage device and said delay circuit, said circuit for subtracting said delayed input value from a noiseless value selected from said second storage device to produce an error output;

a decoder circuit responsive to said detector circuit, said decoder circuit for decoding the binary decision output to produce binary data blocks and error correction code data blocks; and an error correction code decoding circuit responsive to said decoder circuit.

41. A magnetic data recording system having a head/disk assembly, comprising:

a write circuit for converting a sequence of data bits that are to be written onto a recording medium in the head/disk assembly to a recording signal;

a preamplifier for filtering a signal that is read from the recording medium;

an equalizer responsive to said preamplifier, said equalizer for producing a target response signal from said filtered signal;

a detector circuit responsive to said equalizer, said detector circuit comprising:

a storage device for storing a plurality of values, said values corresponding to the squared errors computed between all possible noiseless responses, said storage device outputting certain of said stored plurality of values in response to the input sequence of data, said storage device having a read port and a write port, said read port for reading said values corresponding to the squared errors and said write port for writing said values corresponding to the squared errors; and a Viterbi circuit responsive to said storage device, said Viterbi circuit for computing a binary decision output;

a decoder circuit responsive to said detector circuit, said decoder circuit for decoding the binary decision output to produce binary data blocks and error correction code data blocks; and an error correction code decoding circuit responsive to said decoder circuit.

42. The system of claim 41 wherein said detector circuit further comprises an error output circuit, said error output circuit responsive to the input sequence of data and said Viterbi circuit, said circuit for producing an error output value.

43. The system of claim 42 wherein said error output circuit comprises:

a second storage device responsive to the input sequence of data and said Viterbi circuit, said second storage device for storing a plurality of values, said values representing a plurlaity of possible output patterns of noiseless values;

a delay circuit for producing a delayed input value from the input sequence of data; and a circuit responsive to said second storage device and said delay circuit, said circuit for subtracting said delayed input value from a noiseless value selected from said second storage device to produce an error output.

44. A magnetic data recording system having a head/disk assembly, comprising:

a write circuit for converting a sequence of data bits that are to be written onto a recording medium in the head/disk assembly to a recording signal;

a preamplifier for filtering a signal that is read from the recording medium;

an equalizer responsive to said preamplifier, said equalizer for producing a target response signal from said filtered signal;

a detector circuit responsive to said equalizer, said detector circuit comprising:

a magnetic recording medium for storing a plurality of values, said values corresponding to the squared errors computed between all possible input values to the detector circuit and all possible noiseless responses, said magnetic recording medium outputting certain of said stored plurality of values in response to the input sequence of data; and a Viterbi circuit responsive to said magnetic recording medium, said Viterbi circuit for computing a binary decision output;

a decoder circuit responsive to said detector circuit, said decoder circuit for decoding the binary decision output to produce binary data blocks and error correction code data blocks; and an error correction code decoding circuit responsive to said decoder circuit.

45. The system of claim 44 wherein said detector circuit further comprises an error output circuit, said error output circuit responsive to the input sequence of data and said Viterbi circuit, said circuit for producing an error output value.

46. The system of claim 44 wherein said error output circuit comprises:

a storage device responsive to the input sequence of data and said Viterbi circuit, said storage device for storing a plurality of values, said values representing a plurality of possible output patterns of noiseless values;

a delay circuit for producing a delayed input value from the input sequence of data; and a circuit responsive to said storage device and said delay circuit, said circuit for subtracting said delayed input value from a noiseless value selected from said storage device to produce an error output.

47. A method for detecting a data sequence from an input sequence of data, comprising the steps of:

retrieving a plurality of values from a storage device in response to the input sequence of data, said values corresponding to the squared errors computed between all possible input values and all possible noiseless responses;

detecting the data sequence using a Viterbi Algorithm in response to said plurality of retrieved values; and computing an error output value in response to said detected data sequence and said input sequence of data, said computing including:

retrieving a plurality of values from a second storage device, said values representing a plurality of possible output patterns of noiseless values;

delaying the input sequence of data; and computing the error output value in response to said plurality of values and said delayed input sequence of data.

* * * * *